United States Patent
Tester

(10) Patent No.: US 6,650,266 B1
(45) Date of Patent: Nov. 18, 2003

(54) DIGITAL TO ANALOG CONVERTER USING CONTROL SIGNALS AND METHOD OF OPERATION

(75) Inventor: David Tester, Preston (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/234,014

(22) Filed: Sep. 3, 2002

(51) Int. Cl.⁷ .................................................. H03M 1/66
(52) U.S. Cl. ...................................................... 341/144
(58) Field of Search .......................... 341/144; 365/68; 327/57, 107

(56) References Cited

U.S. PATENT DOCUMENTS

| | | | |
|---|---|---|---|
| 4,481,511 A | * 11/1984 | Hanmura et al. | 345/100 |
| 4,752,767 A | * 6/1988 | Maio et al. | 341/148 |
| 5,084,701 A | * 1/1992 | Sauerwald | 341/118 |
| 6,469,947 B2 | * 10/2002 | Park | 365/222 |
| 6,509,854 B1 | * 1/2003 | Morita et al. | 341/144 |

* cited by examiner

*Primary Examiner*—Peguy Jeanpierre
(74) *Attorney, Agent, or Firm*—Sawyer Law Group LLP

(57) ABSTRACT

The present invention may relate to a digital to analog converter for converting a digital signal to an analog signal. The digital to analog converter may comprise decoder logic, an array of clocked sub-circuits, a clock generator and a clock signal controller. The decoder logic may be configured to decode the digital signal to a plurality of control signals for controlling generation of the analog signal. The array of clocked sub-circuits may be configured to receive the control signals. The clock generator may be configured to generate a clock signal for clocking the sub-circuits. The clock signal controller may be configured to inhibit application of the clock signal to one or more of the sub-circuits.

16 Claims, 8 Drawing Sheets

|  SIGNALS 78 | | | | GROUPS 30 | | | |
|---|---|---|---|---|---|---|---|
| 78a | 78b | 78c | 78d | GROUP 30a | GROUP 30b | GROUP 30c | GROUP 30d |
| 0 | 0 | 0 | 1 | ENTIRELY OFF | ENTIRELY OFF | ENTIRELY OFF | PARTLY ON |
| 0 | 0 | 1 | 1 | ENTIRELY OFF | ENTIRELY OFF | PARTLY ON | ENTIRELY ON |
| 0 | 1 | 1 | 1 | ENTIRELY OFF | PARTLY ON | ENTIRELY ON | ENTIRELY ON |
| 1 | 1 | 1 | 1 | PARTLY ON | ENTIRELY ON | ENTIRELY ON | ENTIRELY ON |

FIG. 5

DIGITAL TO ANALOG CONVERTER USING CONTROL SIGNALS AND METHOD OF OPERATION

FIELD OF THE INVENTION

The present invention may relate to a digital to analog converter (DAC), and to a method of operation of the same. The invention may be especially suitable for implementation in an integrated circuit, but the invention is not limited exclusively to such an implementation.

BACKGROUND TO THE INVENTION

One form of conventional DAC comprises a plurality of switchable (or steerable) current sources coupled to a summing junction, and decoder logic for decoding a digital input signal to control a respective number of the current sources to generate a net current at the summing junction dependent on the digital input signal. A design feature for improving speed performance is that the decoder logic operates asynchronously with respect to the current sources. A clock signal is supplied to the current sources to control sampling of the output of the decoder logic. An extensive clock distribution network is employed to distribute the clock to each of the current cells. Relatively high currents are used to enable high speed clocking and switching of sampling flip-flops. In particular, high currents are used for DAC architectures in which a latch (or flip-flop) is employed within each current source. For example, as the size of a DAC architecture increases (for example from an 8-bit architecture to a 10-bit architecture or to a 12-bit architecture), the number of current sources increases in a power series of $2^x$ where x is the number of bits. Each time all of the latches are clocked concurrently, a relatively large current spike is produced. The current spike can cause interference between current sources, and necessitates relatively large smoothing capacitors to smooth a power supply to the DAC. The large smoothing capacitors represent additional cost and size implications. Such a large current demand also means that the power consumption is undesirably high.

A further feature to reduce complexity of the decoder logic is that the decoder logic does not address each and every current source independently. Reduced decoder complexity enables a reduction of the die area for, and power consumption of, the decoder logic. Instead of addressing each current source individually, the decoder logic addresses respective ones of the current sources collectively depending on the value of digital input signal. Addressing collectively has repercussions on testing of a DAC after manufacture, in order to measure or validate a linearity. The linearity depends on uniform matching of the different current sources, and the purpose of the test is to identify matching errors between current sources. The test is performed by measuring the net current produced by plural current sources collectively as the digital input is incremented or decremented progressively over a range of values. In such a situation, the error between current sources becomes progressively masked as the magnitude of the analog output increases. Extremely sensitive, and expensive, measuring equipment is needed to try to detect matching errors. In many cases, accurately measuring the matching error over the entire range of the analogue output is not possible.

SUMMARY OF THE INVENTION

The present invention may relate to a digital to analog converter for converting a digital signal to an analog signal. The digital to analog converter may comprise decoder logic, an array of clocked sub-circuits, a clock generator and a clock signal controller. The decoder logic may be configured to decode the digital signal to a plurality of control signals for controlling generation of the analog signal. The array of clocked sub-circuits may be configured to receive the control signals. The clock generator may be configured to generate a clock signal for clocking the sub-circuits. The clock signal controller may be configured to inhibit application of the clock signal to one or more of the sub-circuits.

Features, objects and advantages of the invention may include: (i) reduction of power consumption; (ii) reduction of interference from the clock distribution network to the current sources; (iii) avoiding or reducing unnecessary clocking of flip flops in the current sources; (iv) an ability to address each current source individually in a test mode; (v) an ability to measure the current from each current source individually; (vi) an ability to detect the matching error equally easily and equally accurately for each current source; (vii) an ability to use inexpensive measuring equipment to measure matching errors and linearity; and/or (viii) an ability to be able to quantify linearity over an entire analog output range of the DAC. Further features, objects and advantages of the invention will become apparent from the following description, claims and drawings.

BRIEF DESCRIPTION OF THE DRAWINGS

Non-limiting embodiments of the invention are now described by way of example only, with reference to the accompanying drawings, in which:

FIG. 5 is a table illustrating decoded values in the clock controller of FIG. 4;

DETAILED DESCRIPTION OF PREFERRED EMBODIMENT

Figure 1:
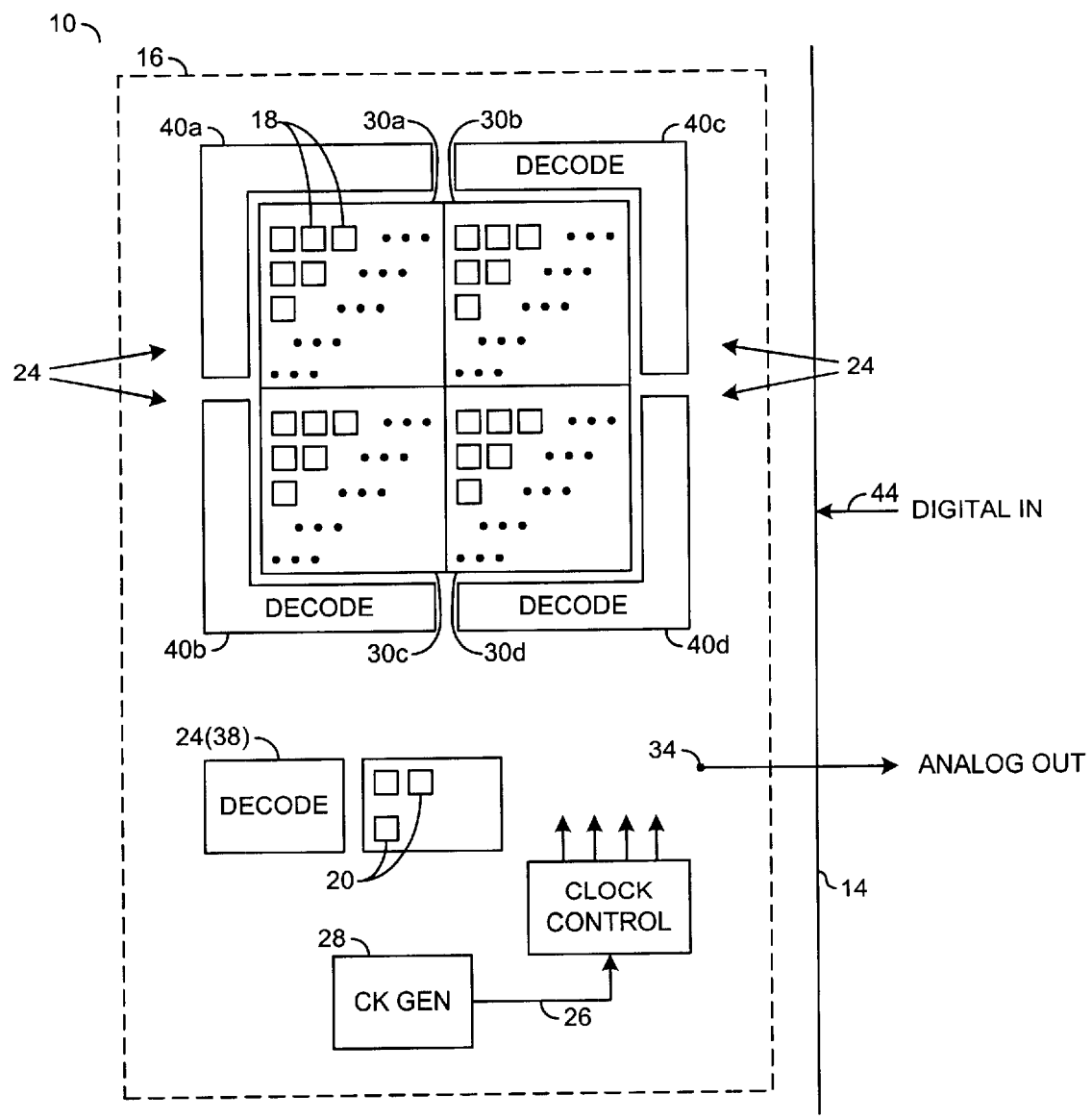
FIG. 1 is a schematic block diagram of a DAC.

Referring to the drawings, an integrated circuit 10 may generally comprise a housing or package (not shown) containing a semiconductor die 14. On the die 14 may be formed a circuit including a DAC 16. The circuit may also include other circuit elements, such as a processor (not shown), memory (not shown) and other interface circuits (not shown), or the circuit may be primarily the DAC 16.

The DAC 16 may generally comprise an arrangement of analog signal sources in the form of first controllable current sources 18 and second controllable current sources 20. The controllable current sources may be controlled by control signals from decoder logic 24 and synchronised by clock signals 26 from a clock generator 28. The first controllable current sources 18 may be arranged in plural block-addressable groups 30. In one embodiment, a number of block-addressable groups 30 may be four, however a greater or smaller number of groups may be used. In one example, the number of groups 30 may be a power of two (for example, 2, 4, 8, 16, etc.). A power of two may in some cases be convenient for handling by the decoder logic 24, as will be apparent from later description. Hereinafter, suffixes a–d may be generally used with reference numerals to denote a respective one of the four block addressable groups 30. In each group 30, the controllable current sources 18 may be arranged generally in a two-dimensional array. Each array may include columns and rows. A number of current sources 18 in each group 30 may be equal. A number of columns and rows may be equal in a group 30. The numbers of rows may be equal between groups 30. The number of columns may be equal between groups 30. The second current sources 20 may be configured for providing currents smaller than the current sources 18 of the block-addressable groups 30. A number of second current sources 20 may be (a power of two) less one, for convenience of addressing as described below. Each second current source 20 may be configured to provide a current that is $1/(n+1)$ times a magnitude of that of each first current source 18, where "n" is the number of second current sources 20. The outputs from all of the current sources 18 and 20 may be summed at an analog signal node 34.

Figure 6:
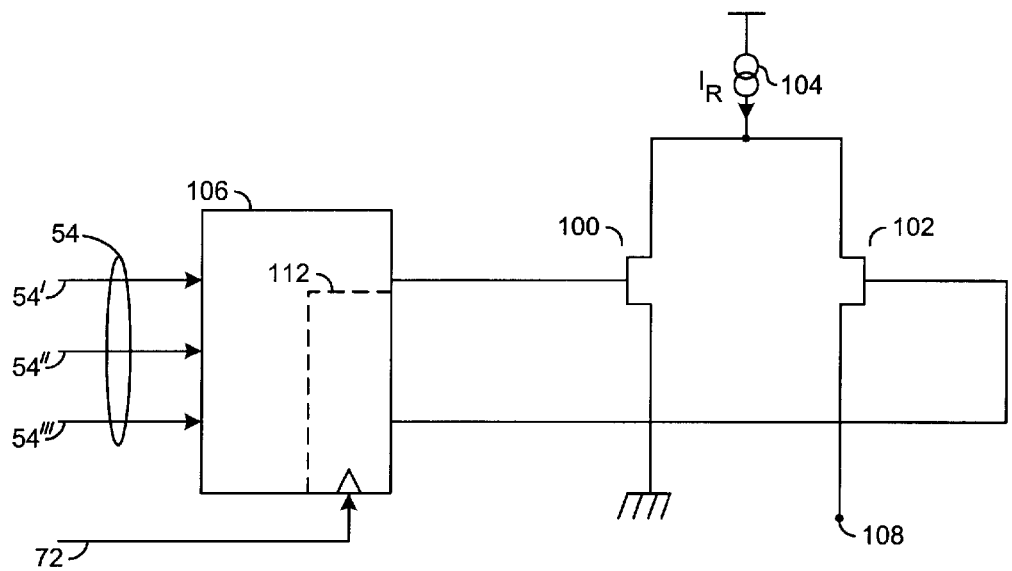
FIG. 6 is a schematic block diagram of a current source used in the DAC of FIG. 1.

Referring to FIG. 6, each controllable current source 18, 20 may be controllable between first and second states. One state may be an "on" state, and the other may be an "off" state. The controllable current sources 18, 20 may be switchable current sources, as referred to below. Each switchable current source 18, 20 may generally be of a current-steering type. Each switchable current source 18, 20 may generally comprise a differential transistor pair 100 and 102 (or multiples thereof) coupled to a stable current source 104. A current $I_R$ delivered by the stable current source 104 may be set by an external reference. The current $I_R$ may be steered through either one or the other of the differential transistors 100 and 102, depending on differential control signals applied to the differential transistors 100 and 102 from a switching logic 106. When the current may be steered through the transistor 102, the current may be fed to an output 108 coupled to the node 34 to contribute to the output current from the DAC 16. The switchable current source 18, 20 may thus be referred to as switched "on". When the current may be steered through the other transistor 100, the current may be sunk internally within the DAC 16, and may not contribute to the output current from the DAC 16. The switchable current source 18, 20 may thus be referred to as switched "off". Such a current-steering circuit may be preferred and may be generally faster "steering" a current using the differential transistor pair 100, 102 than switching a stable current source on or off. The switching logic 106 may receive one or more decoded control signals 54 directly or indirectly from the decoder logic 24, for controlling whether the current source 18, 20 is to be turned on, or off. The switching logic 106 may include a memory element 112 clocked by a clock signal 72 for controlling the timing of the application of the differential control signals to the differential transistors 100 and 102. The term memory element may include, for example, a latch, or a register, or a flip-flop, or any other device which may be set to a desired value, and which may be clocked to control the timing of the device. In the case of a first current source, the decoded control signals 54 may generally include a first (row select) signal 54', a second (complete row select) signal 54" and a third column select signal 54'" (described in more detail below).

The switching logic 106 may be responsive to turn on the current source 18 when the first (row select) signal 54' and the third (column select) signal 54'" may be both asserted. The switching logic may alternatively, or additionally, be responsive to turn on the current source 18 when the second (complete row select) signal 54" may be asserted. Within each group 30 as a whole, a complete row of current sources 18 may be turned on when the second (complete row) select signal 54" for the respective row may be asserted. Otherwise, current sources 18 may be turned on when the current sources 18 are located at an intersection position at which both the first (row select) signal 54' and the third (column select) signal 54'" may be asserted.

Figure 2:
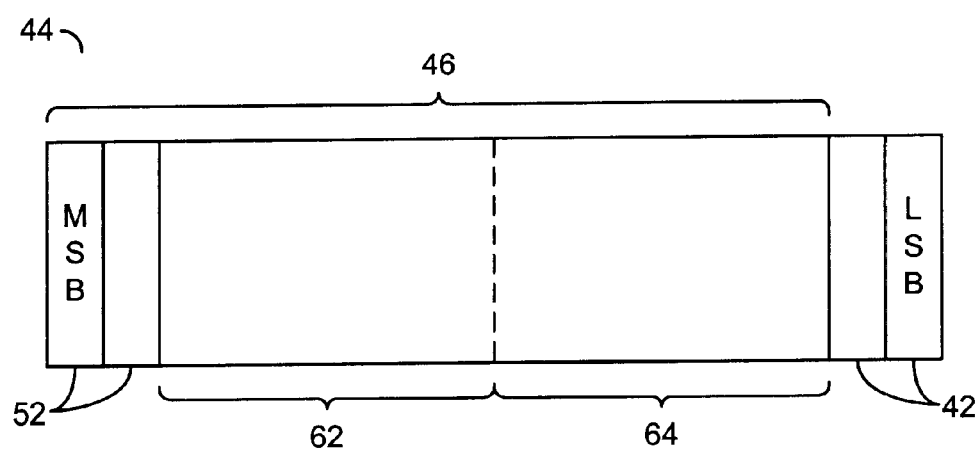
FIG. 2 is a schematic illustration showing how decoding may be applied to a digital word.

Referring to FIGS. 1 and 2, the decoding logic 24 may generally comprise a fine-current decoder 38 and a plurality of group decoders 40a–d. The fine-current decoder 38 may decode two or more least significant bits 42 of a digital input word 44 to control a selected number of the second current sources 20 to be turned "on" according to a value of the least significant bits 42. In the present embodiment, there may be three second current sources 20, which may be turned on/off to provide either zero, one, two or three current units. The number of least significant bits 42 used for addressing the second current sources 20 may be two. A remainder 46 of the word 44 may be used to address the groups 30, and to determine how many of the first current sources 18 are to be turned "on". The groups 30 are block addressable, such that each group 30 may have all internal first current sources 18 turned on (which may be referred to herein as "entirely on"), or may have all of the first current sources 18 turned off (which may be referred to herein as "entirely off"), or may have only a selected number of first current sources turned on (which may be referred to herein as "partially on").

Figure 3:
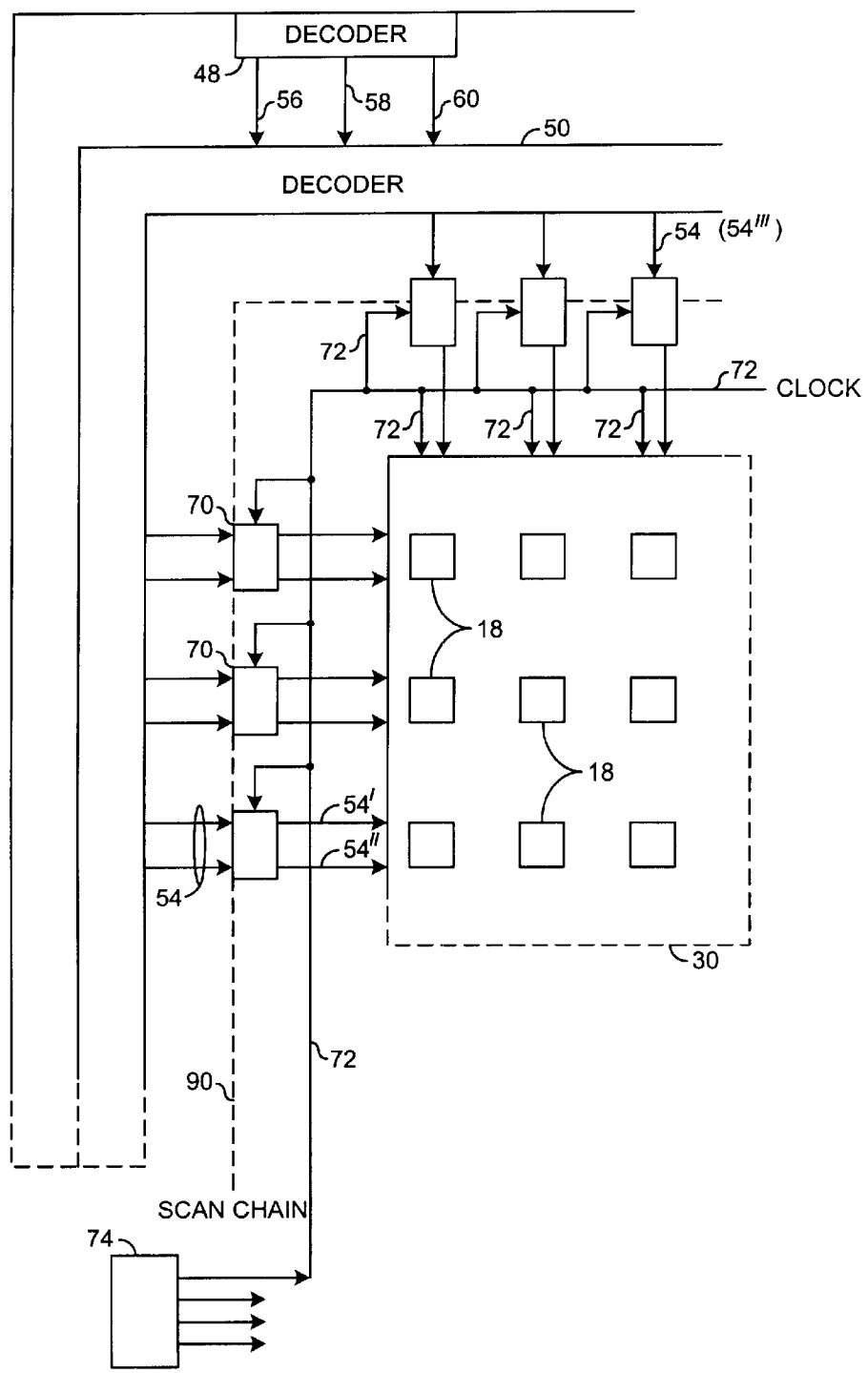
FIG. 3 is a schematic block diagram of a detail of FIG. 1.

FIG. 3 shows one of the group decoders 40 in more detail. The same general description may apply to each group decoder 40. Each group decoder 40 may generally comprise a first decoder 48, and a second decoder 50. The first decoder 48 may be operable to decode two or more most significant bits 52 of the word 44 to identify whether the remainder 46 refers to a logical address in the group 30. The second decoder 50 may be responsive to the first decoder 48 to generate row and column control signals 54 for row/column addressing of the first current sources 18 in the group 30. The row and column signals 54 may include one or more of the aforementioned row select signal 54', complete row select signal 54" and column select signal 54'".

If the value of the most significant bits 52 may be less than a group address, the first decoder 48 may generate a first signal 56 indicative that the respective group may be entirely off. In response to the first signal 56, the second decoder 50 may be operative to generate row and column signals 54 for turning off all of the first current sources 18 in the group. For example, all of the row and column select signals 54', 54" and 54'" may be deasserted. If the value of the most significant bits 52 may be greater than the group address, the first decoder 48 may generate a second signal 58 indicative that the respective group may be entirely on. In response to the second signal 58, the second decoder 50 may be operative to generate row and column signals 54 for turning on all of the first current sources 18 in the group 30. For example, all of the complete row select signals 54" may be asserted. If the value of the most significant bits 52 may equal the group address, then the first decoder 48 may generate a third signal 60 indicative that the group may be partially on. In response to the third signal 60, the second decoder 50 may be operative to decode a row and column address represented by two sub-words 62 and 64 of the word 44, and to generate decoded row and column signals 54 dependent on the values of the decoded sub-words 62 and 64. In response thereto, a selected number of the first current sources 18 in the group may be turned on in accordance with the intersection of the row and column addresses. The sub-words 62 and 64 may represent a logical row and column address. The row and column signals 54 may turn on all current sources 18 having a logical address below the decoded address, and turn off all current sources 18 having a logical address higher than the decoded address. For example, the second decoder 50 may be operative to assert the complete row select signals 54" for each row below the decoded row address. The second decoder 50 may be operative to assert the row select signal 54' for the row corresponding to the decoded row address, and to assert one or more column select signals 54'" for each column up to the decoded column address. As the decoded signal increases, the current sources 18 may thus be turned on progressively within a row by intersections of the asserted row select signal 54' and column select signals 54'". In FIG. 3, the arrangement of the group decoder 40 may be schematic in nature, and different circuit or logic configurations and distributions may be used.

The group decoders 40 may be generally comprised of combinational logic, which may not be clocked. The combination logic may provide that the digital word 44, and any changes thereto, may be decoded as quickly as possible. In order to ensure that the groups 30 of first current sources 18 may be maintained in synchronism, the row and column signals 54 may be sampled by respective flip-flops 70. The flip-flops 70 may act as an interface to the current sources 18. Either the flip-flops 70 or the current sources 18, or both, may form a plurality or array of clockable sub-circuits. The flip-flops may be controlled by respective clock signals 72a–d in each group 30. The clock signals 72a–d may also drive the current sources 18 in each group to ensure that the current sources 18 generally operate in synchronism. Such clocking of the current sources 18 may be desirable to avoid delays or skew caused by variations in signal path lengths along the circuit paths for the row and column control signals 54 to each current source 18, depending on a physical position of the respective current source 18 in the array. A feature may be a provision of a clock controller 74 for controlling the distribution of the clock signals 72a–d to the groups 30a–d. A function of the clock controller 74 may be to determine whether, for each group 30, the row and column signals 54 may have changed since the last clock cycle. For example, if the group 30 was decoded to be either entirely off, or entirely on, in a previous clock cycle, and may be decoded to be in the same state for a current clock cycle, the row and column signals 54 may be considered to be unchanged. Therefore, the clock controller 74 may function to inhibit the clock signal 72 for the determined group 30. Inhibiting the clock signal 72 for one or more entire groups 30 may be advantageous in reducing power consumption, and avoiding unnecessary clocking of the flip-flops 70. Each time the flip-flops 70 are clocked, the flip-flops 70 consume power and there may also be a risk of interference and cross-talk with other circuit elements. A reduction in power consumption may be extremely beneficial, as DACs tend to be relatively inefficient, especially when used at high speeds. Also, a reduction in the current spikes occurring on power supply lines on each clock cycle may enable use of a smaller number and size of smoothing capacitors for the power supply. Particularly for portable, or battery operated, or miniature electronic devices, smaller filters may be highly desirable.

Figure 4:
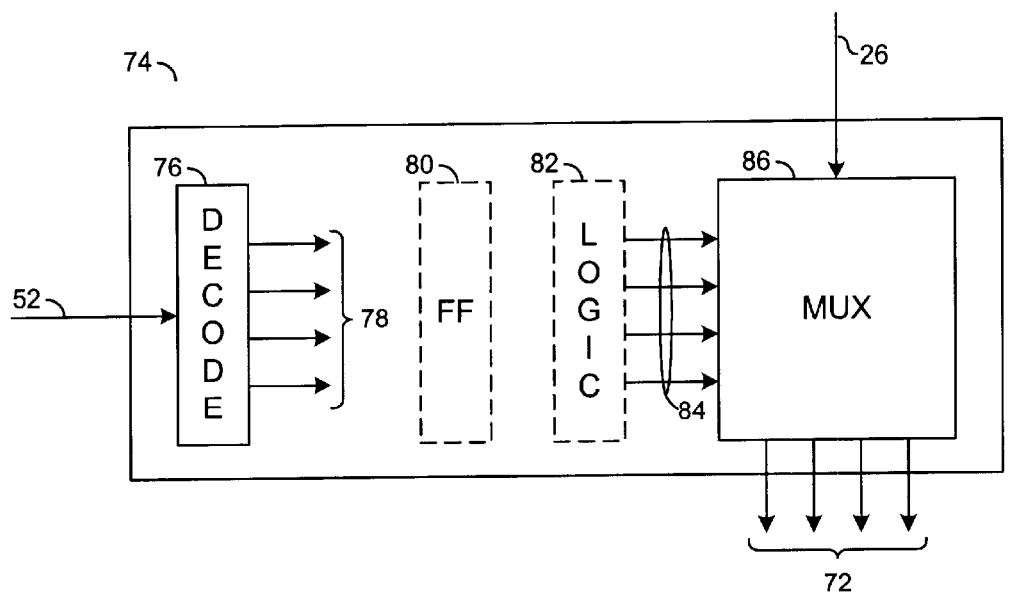
FIG. 4 is a schematic block diagram of a clock controller of FIG. 1.

Referring to FIGS. 4 and 5, the clock controller 74 may comprise a third decoder 76 for decoding the most significant bits 52 of the digital word 44. The third decoder 76 may generate decoded indicator signals 78a–d. As indicated in FIG. 5, the possible decoded values of the most significant bits 52 may be represented by a progressive "1's" signal over the decoded signals 78a–d. In the present embodiment, there may be four such signals 78a–d. The clock controller 74 further comprises flip-flops 80 for temporarily storing signal states for the duration of a clock cycle, and processing logic 82 for comparing the current values derived from the decoded signals 78a–d with corresponding values from the previous clock cycle. The processing logic 82 may function to identify an entirely on condition for a group 30. The entirely on condition may be represented by a pair of "1's". The processing logic 82 may also or alternatively function to identify an entirely off condition for a group 30. The entirely off condition may be represented by a pair of "0's". For each of the possible signal combinations, FIG. 5 may illustrate the respective states of the different groups 30. The processing logic 82 may generate, for each group 30a–d, a respective control signal 84 indicative of whether the clock signal 72 may be inhibited for a determined group 30a–d. In general, the clock signal 72 may be inhibited if the previous state was either entirely off or entirely on, and the state has not changed in the current clock cycle. The clock controller 74 may further include multiplexers 86 responsive to the control signals 84 for controlling distribution of the clock signals 26 as the respective clock signals 72a–d for the groups 30a–d.

Figure 7:
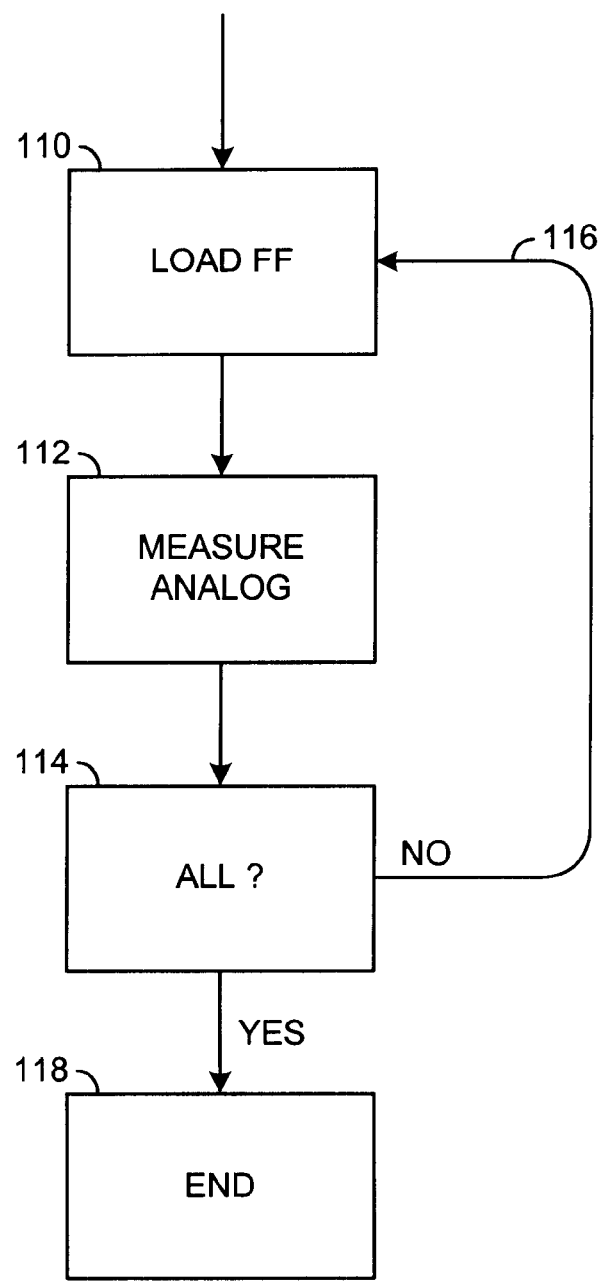
FIG. 7 is a flow diagram illustrating steps for measuring matching errors of current sources.

Ordinarily, the decoding logic 24 may not generate row and column signals 54 which individually address any particular first current source 18 in isolation from all others in the group 30. The reason may be that such addressing may not be required during normal operation of the DAC, because the decoding may be such as to address plural current sources collectively. Therefore, the decoding logic 24 may not be capable of individually addressing current sources 18 for the purpose of linearity measurements. In the present embodiment, the flip-flops 70 may be coupled together in a scan-chain test mode (indicated by the broken line 90 in FIG. 3) to enable values to be serially shifted into the flip-flops 70 from an external source. The scan chain may permit the flip-flops 70 to be set to hold values which might not be generatable from the decoding logic 24. For example, the flip-flops may be loaded with values of the column and row signals 54 to permit individual addressing of any current source 18 in the group 30. For example, the signals may include individual row and column intersection signals 54' and 54'" without the full row select signals 54" which might normally be generated by the second decoder 50 of the group decoder 40. The flip-flops 70 arranged in the row direction may be in the same scan chain as the flip-flops 70 in the column direction (as indicated in FIG. 3), or two different scan chains may be used, one for the column direction and one for the row direction. By sequentially clocking values into and/or along the chain, current sources 18 may be turned on and off individually. FIG. 7 illustrates a method for measuring each current source individually. The method may include a first step 110 of loading values into the flip-flops 70, using the scan-chain path 90. The values may address a single currents source 18 individually. At step 112, an analog output from the DAC 16 may be measured and recorded. The analog output may correspond to the analog current generated from the single addressed current source 18. At step 114, a test may be performed to determine whether all of the current sources 18 have been tested. If not, the method branches on a path 116 back to the first step 110 to load values into the flip-flops 70 for addressing a next current source individually. The combination of steps 116 and 110 may include serially shifting an existing value in one or more of the flip-flops 70 to a new position, instead of replacing all of the contents of the flips-flops 70 entirely. If at step 114 it may be determined that all of the current sources 18 may have been tested, then the method may terminate at 118.

Figure 8:
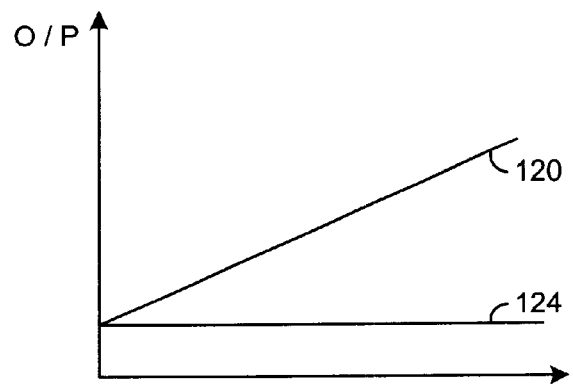
FIG. 8 is a graph comparing the output magnitude from the DAC using two different test methods.
Figure 9:
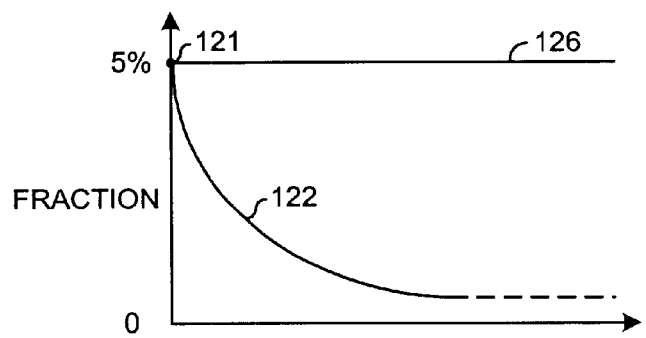
FIG. 9 is a graph comparing the magnitude of the error of an individual current source as a function of the number of current sources addressed, using two different test methods.

An advantage of measuring the performance of each current source 18 individually may be that matching errors between individual current sources may be much more easily detectable than when several current sources are turned on at the same time. The greater the number of current sources that are turned on, the greater may be a masking effect of a large magnitude signal superimposed on the value to be measured. The masking effect may be illustrated by FIGS. 8 and 9. Referring to FIG. 8, a first line 120 generally represents a magnitude of the analog output using a conventional testing approach of progressively increasing the digital input signal to the DAC 16. The line 120 may indicate that the magnitude of the analog output increases progressively as more of the current sources (18) are turned on. Referring to FIG. 9, the fractional variation (to be measured) for each individual current source may be, for example, about 5% of the output of a current source. When a single current source (18) may be turned on at a beginning of the test cycle, then the 5% variation may be easily detectable in the analog output (point 121 in FIG. 9). However, as more current sources (18) may be turned on progressively, the variation to be measured may rapidly fall as a fraction of the analog output, as indicated by line 122. Measuring such a variation over the entire range of analog output values may be extremely difficult, as the measuring equipment has to accept a wide range of analog signals, and have a high resolution.

In contrast, referring again to FIG. 8, by addressing single current sources individually, the magnitude of an analog output signal may remain substantially constant, as indicated by line 124. The analog output may vary slightly as a result of the matching errors between different current sources 18. Referring to FIG. 9, line 126 generally represents the fractional variation to be measured as a fraction of the analog output from the DAC 16. In contrast to the line 122, the line 126 may be substantially level, and may represent fractional values generally greater than (or at least equal to) the line 122. A greater fraction may enable less expensive measuring equipment to be used, having significantly less resolution than that for the conventional test method described above.

The foregoing description is merely illustrative of preferred forms of the invention, and many modifications, developments and equivalents will occur to the skilled person without departing from the scope and/or principles of the invention.

What is claimed is:

1. A digital to analog converter for converting a digital signal to an analog signal, comprising:
    decoder logic configured to (i) decode said digital signal to generate a plurality of control signals, and (ii) generate a first range of control signals;
    a plurality of analog signal sources responsive to said control signals; and
    a plurality of flip-flops configured to interface signals to the analog signal sources, wherein said plurality of flip-flops are operable in:
        a first mode in which the flip flops are configured to receive said control signals from said decoding logic to interface said control signals to said plurality of analog signal sources; and
        a second mode in which respective ones of said flip-flops are coupled in at least one serially shiftable scan chain, to permit at least a majority of said analog signal sources to be individually addressable by inputting control signals via said scan chain.

2. The digital to analog converter according to claim 1, wherein said control signals for individually addressing said analog signal sources are different from said first range of control signals generatable by said decoder logic.

3. A method of operation in a digital to analogue converter for converting a digital signal to an analog signal, the method comprising the steps of:
    (A) decoding said digital signal to a plurality of control signals for controlling a plurality of sub-circuits for generating said analog signal;
    (B) generating a clock signal for clocking said sub-circuits; and
    (C) inhibiting application of said clock signal to one or more of said sub-circuits.

4. The method according to claim 3, wherein step (C) comprises a substep of inhibiting application of said clock signal in dependence on a value of said digital signal.

5. The method according to claim 3, wherein step (C) comprises a substep of inhibiting application of said clock signal in dependence on a change in a value of said digital signal from one clock cycle to a next.

6. A method of operation of a digital to analog converter for converting a digital signal to an analog signal, said method comprising the steps of:
    (A) decoding said digital signal to generate a plurality of control signals in a first range of values of said control signals; and
    (B) operating a plurality of flip-flops in one of:
        a first mode comprising receiving said control signals from said decoding step and interfacing said control signals to a plurality of analog signal sources for generating said analog value therefrom; and
        a second mode comprising coupling respective ones of said flip-flops in at least one serially shiftable scan chain, and inputting external values to said flip-flops via said scan chain, to individually address at least one of said analog signal sources.

7. The method according to claim 6, wherein said external values are in a second range of values different from said first range of values.

8. A method of measuring linearity of a digital to analog converter, said method comprising the steps of:
    (A) configuring a plurality of flip-flops in at least one serially shiftable scan chain;
    (B) loading values into said flip-flops via said scan chain, to individually actuate different ones of a plurality of analog signal sources in said digital to analog converter, at respective different times; and
    (C) measuring an analog output from said digital to analogue converter for each actuation of an individual analog signal source.

9. A digital to analog converter for converting a digital signal to an analog signal, comprising:
    means for decoding said digital signal and to generate a plurality of control signals in a first range of values of said control signals; and
    means for operating a plurality of flip-flops in one of:
        a first mode comprising receiving said control signals from said decoding step and interfacing said control signals to a plurality of analog signal sources for generating said analog value therefrom; and a second mode comprising coupling respective one of said flip-flops in at least one serially shiftable scan chain, and inputting external values to said flip-flops via said scan chain, to individually address at least one of said analog signal sources.

10. A digital to analog converter for converting a digital signal to an analog signal, comprising:

decoder logic configured to decode said digital signal to a plurality of control signals for controlling generation of said analog signal;

an array of clocked sub-circuits configured to receive said control signals;

a clock generator configured to generate a clock signal for clocking said sub-circuits; and clock signal controller configured to inhibit application of said clock signal to one or more of said sub-circuits, wherein said clock signal controller comprises:

at least one flip flop configured to temporarily store at least one indicator signal derived from said digital signal, for a duration of at least one clock cycle; and processing logic for processing a stored value and a current value of said indicator signal to determine whether to inhibit said clock signal to said one or more of said sub-circuits in dependence on a change of a value of said digital signal from one clock cycle to another.

11. A digital to analog converter for converting a digital signal to an analog signal, comprising:

decoder logic configured to decode said digital signal to a plurality of control signals for controlling generation of said analog signal;

an array of clocked sub-circuits configured to receive said control signals;

a clock generator configured to generate a clock signal for clocking said sub-circuits; and a clock signal controller, which comprises at least one flip flop, configured to inhibit application of said clock signal to one or more of said sub-circuits, wherein said array of clocked sub-circuits has an architecture arranged as a plurality of groups of said sub-circuits, and wherein said clock signal controller is further configured to inhibit application of said clock signal selectively to at least one of said groups of said sub-circuits.

12. A digital to analog converter for converting a digital signal to an analog signal, comprising:

decoder logic configured to decode said digital signal to a plurality of control signals for controlling generation of said analog signal;

an array of clocked sub-circuits configured to receive said control signals;

a clock generator configured to generate a clock signal for clocking said sub-circuits; and a clock signal controller configured to inhibit application of said clock signal to one or more of said sub-circuits, wherein said array of clocked sub-circuits has an architecture arranged as a plurality of groups of said sub-circuits, and wherein said clock signal controller is further configured to inhibit application of said clock signal selectively to a respective group in dependence on a change of a value of said digital signal from one clock cycle to another.

13. A digital to analog converter for converting a digital signal to an analog signal, comprising:

decoder logic configured to decode said digital signal to a plurality of control signals for controlling generation of said analog signal;

an array of clocked sub-circuits configured to receive said control signals;

a clock generator configured to generate a clock signal for clocking said sub-circuits; and a clock signal controller configured to inhibit application of said clock signal to one or more of said sub-circuits, wherein said clock signal controller comprises:

at least one flip flop configured to temporarily store at least one indicator signal derived from said digital signal, for a duration of at least one clock cycle; and processing logic for processing a stored value and a current value of said indicator signal to determine whether to inhibit said clock signal, wherein said array of clocked sub-circuits has an architecture arranged as a plurality of groups of said sub-circuits, and wherein said clock signal controller is further configured to inhibit application of said clock signal selectively to a respective group in dependence on a change of a value of said digital signal from one clock cycle to another.

14. A digital to analog converter for converting a digital signal to an analog signal, comprising:

decoder logic configured to decode said digital signal to a plurality of control signals for controlling generation of said analog signal;

an array of clocked sub-circuits configured to receive said control signals;

a clock generator configured to generate a clock signal for clocking said sub-circuits; and a clock signal controller configured to inhibit application of said clock signal to one or more of said sub-circuits, wherein said array of clocked sub-circuits has an architecture arranged as a plurality of groups of said sub-circuits, and wherein said clock signal controller is further configured to inhibit application of said clock signal for a group when all of a plurality of analog signal sources in said group remain in an "off" condition from one clock cycle to a next.

15. A digital to analog converter for converting a digital signal to an analog signal, comprising:

decoder logic configured to decode said digital signal to a plurality of control signals for controlling generation of said analog signal;

an array of clocked sub-circuits configured to receive said control signals;

a clock generator configured to generate a clock signal for clocking said sub-circuits; and a clock signal controller configured to inhibit application of said clock signal to one or more of said sub-circuits, wherein said array of clocked sub-circuits has an architecture arranged as a plurality of groups of said sub-circuits, and wherein said clock signal controller is further configured to inhibit application of said clock signal for a group when all of a plurality of analog signal sources in said group remain in an "on" condition from one clock cycle to a next.

16. A digital to analog converter for converting a digital signal to an analog signal, comprising:

decoder logic configured to decode said digital signal to a plurality of control signals for controlling generation of said analog signal;

an array of clocked sub-circuits configured to receive said control signals;

a clock generator configured to generate a clock signal for clocking said sub-circuits; and a clock signal controller configured to inhibit application of said clock signal to one or more of said sub-circuits, wherein said array of sub-circuits includes a plurality of flip-flops configured to sample said control signals from said decoder logic, wherein said flip-flops are configured in (i) a first mode in which said flip flops accept values from said decoding logic, and (ii) a second mode in which said flip-flops accept values from at least one serially shiftable scan chain to permit said flip flops to be loaded with values not generatable by said decoder logic.

* * * * *